United States Patent

Ohashi

(10) Patent No.: US 9,085,146 B2
(45) Date of Patent: Jul. 21, 2015

(54) LIQUID EJECTING HEAD, LIQUID EJECTING APPARATUS AND PIEZOELECTRIC ELEMENT

(71) Applicant: SEIKO EPSON CORPORATION, Tokyo (JP)

(72) Inventor: Koji Ohashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/058,111

(22) Filed: Oct. 18, 2013

(65) Prior Publication Data

US 2014/0111582 A1    Apr. 24, 2014

(30) Foreign Application Priority Data

Oct. 24, 2012 (JP) ................. 2012-234491

(51) Int. Cl.
| | |
|---|---|
| B41J 2/045 | (2006.01) |
| B41J 2/14 | (2006.01) |
| H01L 41/08 | (2006.01) |
| H01L 41/09 | (2006.01) |
| B41J 2/16 | (2006.01) |

(52) U.S. Cl.
CPC ............ *B41J 2/14233* (2013.01); *B41J 2/161* (2013.01); *B41J 2/1628* (2013.01); *B41J 2/1629* (2013.01); *B41J 2/1646* (2013.01); *H01L 41/0815* (2013.01); *H01L 41/0973* (2013.01)

(58) Field of Classification Search
CPC .............. B41J 2/14233; B41J 2/161; B41J 2002/1425; B41J 2002/14258; B41J 2/14274; H01L 41/083; H01L 41/08; H01L 41/1876; H01L 41/0471
USPC ................. 347/68, 70–72; 310/311, 328, 358
See application file for complete search history.

(56) References Cited

U.S. PATENT DOCUMENTS

| | | | |
|---|---|---|---|
| 7,320,163 B2 | 1/2008 | Xin-Shan et al. | |
| 7,411,339 B2 | 8/2008 | Xin-Shan et al. | |
| 7,562,451 B2 | 7/2009 | Ito et al. | |
| 8,567,926 B2 * | 10/2013 | Kobayashi et al. | 347/71 |
| 2005/0190239 A1 | 9/2005 | Ito et al. | |
| 2008/0034563 A1 | 2/2008 | Xin-Shan et al. | |
| 2010/0123761 A1 | 5/2010 | Saito | |

FOREIGN PATENT DOCUMENTS

| | | |
|---|---|---|
| JP | 2005-168172 | 6/2005 |
| JP | 2005-176433 | 6/2005 |
| JP | 2005-228983 | 8/2005 |
| JP | 2005-260003 | 9/2005 |
| JP | 2005-294438 | 10/2005 |
| JP | 2005-295786 | 10/2005 |
| JP | 2007-180249 | 7/2007 |
| JP | 2009-272642 | 11/2009 |
| JP | 2010-120270 | 6/2010 |
| JP | 2010-173197 | 8/2010 |
| WO | 2005-056295 | 6/2005 |

\* cited by examiner

*Primary Examiner* — An Do
(74) *Attorney, Agent, or Firm* — Workman Nydegger (57) ABSTRACT

A liquid ejecting head includes a piezoelectric element, which is provided above a zirconium oxide layer having a piezoelectric layer and an electrode provided on the piezoelectric layer, in which the zirconium oxide layer is formed through a liquid-phase method and preferentially oriented with a (111) plane.

8 Claims, 8 Drawing Sheets

FIG. 9A
EXAMPLE 1

FIG. 9B
COMPARATIVE EXAMPLE 1

LIQUID EJECTING HEAD, LIQUID EJECTING APPARATUS AND PIEZOELECTRIC ELEMENT

BACKGROUND

1. Technical Field

The present invention relates to a liquid ejecting head which has a piezoelectric element provided with a vibration plate including a zirconium oxide layer, a liquid ejecting apparatus and the piezoelectric element.

2. Related Art

As a piezoelectric element used in a piezoelectric device, there is a piezoelectric element in which a ferroelectric layer made of a piezoelectric material that exhibits an electro-mechanical conversion function, for example, a crystallized dielectric material is configured to be interposed between two electrodes. As the piezoelectric element mentioned above, the piezoelectric element provided with a zirconium oxide ($ZrO_2$) layer as a portion of a vibration plate has been known.

Then, a method has been proposed in which a metallic zirconium layer is formed by the sputtering method and the zirconium oxide layer is formed by thermal oxidization of the metallic zirconium layer (Refer to JP-A-2005-260003 and JP-A-2005-294438).

In the related art mentioned above, a zirconium oxide is preferentially oriented with a (−111) plane to achieve improved adhesion between a ground layer and a zirconium oxide film. However, even in a piezoelectric element having the above-mentioned structure, the adhesion between the zirconium oxide layer and a first electrode provided on the zirconium oxide layer, and the adhesion between the zirconium oxide layer and a silicon oxide film provided under the zirconium oxide layer are insufficient, thereby leading to a decrease in reliability.

A patent has been filed previously based on the knowledge that the above-mentioned disadvantages in adhesion can be solved by forming the zirconium oxide through a liquid-phase method. However, in forming of the zirconium oxide by the liquid-phase method, another disadvantage such as occurrence of a crack has been manifested.

The above-mentioned disadvantage is present not only in an actuator mounted on a liquid ejecting head such as an ink jet type recording head, but also in the actuator mounted on other devices as well.

SUMMARY

An advantage of some aspects of the invention is to provide a liquid ejecting head, a liquid ejecting apparatus and a piezoelectric element which include a crackless zirconium oxide film processed by a liquid-phase method to excel in adhesion with a ground layer of a vibration plate or a first electrode.

According to an aspect of the invention, there is provided the liquid ejecting head which includes the piezoelectric element, which is provided above the zirconium oxide layer having a piezoelectric layer and an electrode provided on the piezoelectric layer, in which the zirconium oxide layer is formed through the liquid-phase method and preferentially oriented with a (111) plane.

According to the aspect of the invention, it is possible to form the zirconium oxide layer to be minute and crackless. Therefore, it is possible to improve the adhesion between the zirconium oxide layer and the ground layer or an upper layer, for example, the electrode and to realize the crackless liquid ejecting head which excels in durability.

It is preferable that the zirconium oxide layer be made of a crystal such as monoclinic crystal or cubic crystal. Accordingly, it is possible to realize the zirconium oxide layer to be more minute and crackless.

Further, it is preferable that the zirconium oxide layer have a structure of granular crystal. Accordingly, it is possible to realize the zirconium oxide layer to be more minute and crackless.

According to another aspect of the invention, there is provided a liquid ejecting apparatus including the liquid ejecting head according to the above-mentioned aspect of the invention.

In this case, it is possible to provide the liquid ejecting apparatus which includes the liquid ejecting head in which the crackless zirconium oxide layer can be realized, the adhesion between the zirconium oxide layer and the ground layer or the upper layer is excellent, and which excels in durability.

According to still another aspect of the invention, there is provided a piezoelectric element, which is provided above the zirconium oxide layer, including the piezoelectric layer and the electrode provided on the piezoelectric layer, in which the zirconium oxide layer is formed through the liquid-phase method and preferentially oriented with the (111) plane.

In this case, it is possible to form the zirconium oxide layer to be minute and crackless. Accordingly, it is possible to improve the adhesion between the zirconium oxide layer and the ground layer or the upper layer, and realize the piezoelectric element which excels in durability.

It is preferable that the zirconium oxide layer be made of a crystal such as monoclinic crystal or cubic crystal. Accordingly, it is possible to realize the zirconium oxide layer to be more minute and crackless.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on embodiments.

Embodiment 1

Figure 1:
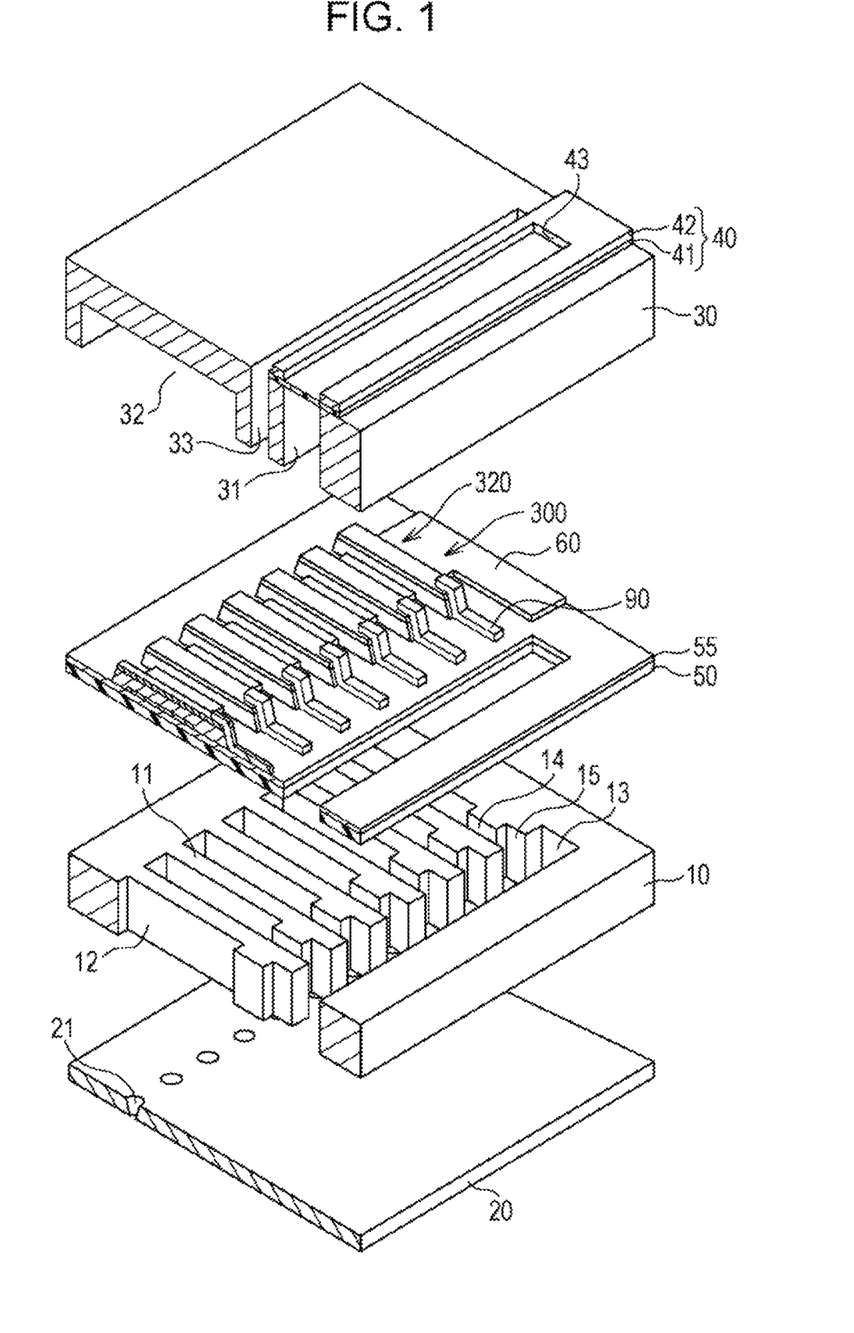
FIG. 1 is an exploded perspective view illustrating a schematic configuration of a recording head according to an Embodiment 1.
Figure 2:
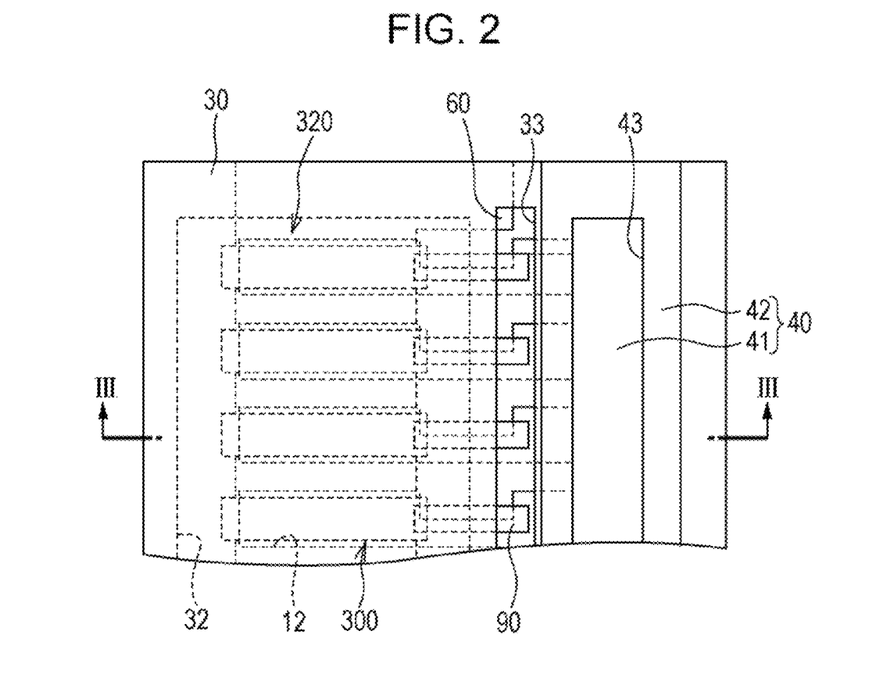
FIG. 2 is a plan view of the main portion of the recording head according to the Embodiment 1.
Figure 3:
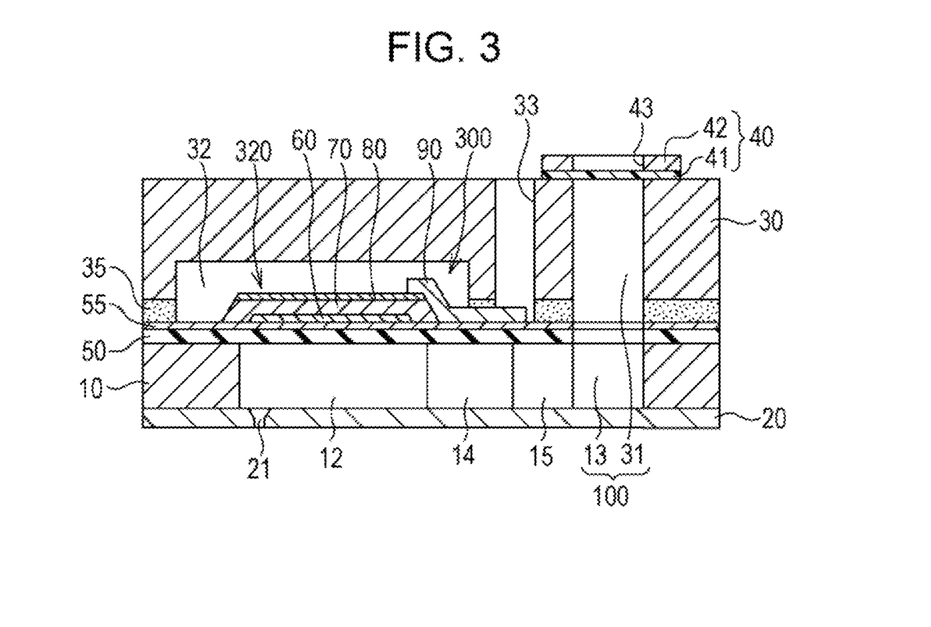
FIG. 3 is a cross-sectional view of the recording head taken along the line III-III according to the Embodiment 1.

FIG. 1 is an exploded perspective view illustrating a schematic configuration of an ink jet type recording head which is an example of a liquid ejecting head having an actuator according to an Embodiment 1. FIG. 2 is a plan view of the main portion of the ink jet type recording head. FIG. 3 is a cross-sectional view taken along the line III-III in FIG. 2.

As illustrated in drawings, a flow channel forming substrate 10 is made of a silicon single crystal substrate with a (110) plane orientation in the embodiment. On a surface thereof, an elastic film 50 with a thickness of 0.5 to 2 μm, which is made of silicon dioxide ($SiO_2$) previously processed by thermal oxidization, is formed. In the flow channel forming substrate 10, a plurality of pressure generation chambers 12 partitioned by partition walls 11 are provided in a parallel manner in a first direction which is the width direction (short direction) thereof. In addition, a communication portion 13 is formed at a region outside the pressure generation chambers 12 of the flow channel forming substrate 10 in the longitudinal direction, that is, a second direction orthogonal to the first direction. The communication portion 13 and the respective pressure generation chambers 12 communicate with each other via ink supply channels 14 and communication channels 15 which are respectively provided in each pressure generation chamber 12. The communication portion 13 communicates with a manifold portion 31 of a protective substrate mentioned below to configure a portion of the manifold which becomes a common ink chamber for respective pressure generation chambers 12.

The ink supply channel 14 communicates with an end portion side of the pressure generation chamber 12 in the longitudinal direction, and have a smaller cross-sectional area than that of the pressure generation chamber 12. For example, in the embodiment, the ink supply channel 14 is formed to have a narrower width than the width of the pressure generation chamber 12 by narrowing a flow channel at the pressure generation chamber 12 side located between a manifold 100 and each pressure generation chamber 12 in the width direction. In this manner, the ink supply channel 14 is formed by narrowing the width of the flow channel at one side in the embodiment. However, the ink supply channel 14 may be formed by narrowing the width of the flow channel at both sides. In addition, the ink supply channel 14 may be formed by narrowing the width of the flow channel in the thickness direction, instead of narrowing the width of the channel. Further, each communication channel 15 communicates with the opposite side of the pressure generation chamber 12 of the ink supply channel 14, and has a larger cross-sectional area than that of the ink supply channel 14 in the width direction (short direction).

In addition, at an opening surface side of the flow channel forming substrate 10, a nozzle plate 20, in which nozzle openings 21 communicating with the vicinity of the end portion at the opposite side of the ink supply channel 14 of each pressure generation chamber 12 are drilled, is fixedly attached by an adhesive or a heat welding film. Further, the nozzle plate 20 is made of glass ceramics, the silicon single crystal substrate or stainless steel.

Meanwhile, at the opposite side of the opening surface of the flow channel forming substrate 10, as mentioned above, the elastic film 50 made of the silicon dioxide with a thickness of, for example, about 1.0 μm is formed. On the elastic film 50, a zirconium oxide layer 55 made of zirconium oxide ($ZrO_2$) with a thickness of, for example, about 0.1 to 0.5 μm is laminated.

As mentioned below, the zirconium oxide layer 55 of the embodiment is formed by the liquid-phase method. The zirconium oxide layer 55 formed by the liquid-phase method is extremely more minute than the zirconium oxide layer formed by the gas-phase method. Accordingly, adhesion to an electrode, which is provided above a ground layer or the zirconium oxide layer 55, and durability are increased. Further, the zirconium oxide layer 55 is preferentially oriented with a (111) plane.

Here, a preferentially oriented state with the (111) plane represents that peak intensity of diffraction intensity corresponding to the (111) plane is greater than the peak of the diffraction intensity corresponding to other planes, and a degree of orientation with the (111) plane is preferably 50% or more. Accordingly, as mentioned below, occurrence of a crack in the zirconium oxide layer 55 is prevented. Further, the "degree of orientation" represents a ratio of the diffraction intensity generated when the zirconium oxide layer is measured by the wide angle X-ray diffraction method. Specifically, if the zirconium oxide layer is measured by the wide angle X-ray diffraction method, the peaks of the diffraction intensity corresponding to a (011) plane, (−111) plane, (200) plane, (111) plane and (−112) plane are generated, and the "degree of (111) plane orientation" represents a ratio of the peak intensity corresponding to the (111) plane with respect to the sum of the peak intensity corresponding to the respective planes. Meanwhile, the crystal of the zirconium oxide is known to generate a phase change between the monoclinic crystal and cubic crystal by heat. Any type of crystalline state may be employed. However, it is verified that the monoclinic crystal is employed in the embodiment as mentioned below.

Here, it has been verified that the oriented state of the zirconium oxide layer 55 changes due to the conditions such as composition of a coating liquid in the liquid-phase method, drying after coating, degreasing, calcining and firing.

A manufacturing method of the zirconium oxide layer 55 by the liquid-phase method is not particularly limited. However, it is preferable that metal alkoxide containing Zr or precursor solution containing metal carboxylate coat the flow channel forming substrate 10 having the elastic film 50. Thereafter, the zirconium oxide layer 55 is formed through the drying, degreasing, calcining and firing. According to the liquid-phase method, since a vacuum unit is not essential as in a case of the gas-phase method, environmental loads are small, thereby having an advantage to be able to deal with mass production at low cost.

In addition, the crystalline state of the zirconium oxide layer 55 formed by the liquid-phase method may be any one of a granular crystal state and columnar or close-to-columnar crystal state, and either crystal state may be employed. However, since the granular crystal state is more minute than the columnar or close-to-columnar crystal state, the granular crystal state is preferable in consideration of the adhesion.

In addition, piezoelectric elements 300, which are configured to include a first electrode film 60 having a thickness of, for example, about 0.03 to 0.2 m, a piezoelectric layer 70 having a thickness of, for example, about 0.5 to 5 m and a second electrode film 80 having a thickness of, for example, about 10 to 200 nm, are formed on the zirconium oxide layer 55.

Here, the piezoelectric element 300 represents a portion including the first electrode film 60, the piezoelectric layer 70 and the second electrode film 80. Generally, either electrode of the piezoelectric element 300 is set as the common electrode, and the other electrode and the piezoelectric layer 70 are configured to be patterned with respective pressure generation chambers 12. Moreover, in this case, a portion configured to include either one of the electrode and the piezoelectric layer 70 which are patterned, and where piezoelectric distortion is generated due to applying of a voltage to both the electrodes is referred to as a piezoelectric active portion 320. In the embodiment, the first electrode film 60 is set to be the common electrode of the piezoelectric element 300, and the second electrode film 80 is set to be an individual electrode of the piezoelectric element 300. However, the first electrode film 60 and the second electrode film 80 may be conversely set in accordance with the conditions of a drive circuit or wirings. In either case, the piezoelectric active portions 320 are formed in respective pressure generation chambers 12. Further, in the embodiment, the first electrode film 60, the piezoelectric layer 70 and the second electrode film 80 are patterned to have a narrow width at the side of the second electrode film 80, as illustrated in FIG. 3, such that the side surface thereof is inclined. In this case, although both the piezoelectric element 300 and a vibration plate where displacement is generated in accordance with driving of the piezoelectric element 300 are referred to as the piezoelectric element, the piezoelectric element 300 and the vibration plate may be also referred to as an actuator. In the example mentioned above, although the elastic film 50, the zirconium oxide layer 55 and the first electrode film 60 act as the vibration plate, as a matter of course it is not limited thereto. The zirconium oxide layer 55 and the first electrode film 60 may act as the vibration plate without providing the elastic film 50.

The first electrode film 60 is provided on the zirconium oxide layer 55. As the first electrode film 60 of the embodiment, various metals such as iridium (Ir), platinum (Pt), titanium (Ti) and tungsten (W), or a laminated electrode structure of conductive complex oxide such as alloys of the above-mentioned various metals, $LaNiO_3$ and $SrRuO_3$, and various metal films may be exemplified.

As a material of the piezoelectric layer 70 (piezoelectric material) configuring the piezoelectric element 300 in the embodiment, for example, a ferroelectric and piezoelectric material such as lead zirconate titanate (PZT), or a relaxer ferroelectric made of the ferroelectric and piezoelectric material with metals such as niobium, nickel, magnesium, bismuth and yttrium added thereto is used.

In addition, the piezoelectric layer 70 may be formed by a lead-free piezoelectric material. As the lead-free piezoelectric material, complex oxides $(x[(Bi_xK_{1-x})TiO_3]-(1-x)[BiFeO_3]$, abbreviated to "BKT-BF") having a perovskite structure and containing bismuth ferrite (($BiFeO_3$), abbreviated to "BFO"); barium titanate (($BaTiO_3$), abbreviated to "BT"); potassium sodium niobate ((K,Na)($NbO_3$), abbreviated to "KNN"); potassium sodium niobate lithium ((K,Na,Li)($NbO_3$)); niobate tantalate potassium sodium lithium ((K,Na,Li)(Nb,Ta)$O_3$); bismuth potassium titanate (($Bi_{1/2}K_{1/2}$)$TiO_3$, abbreviated to "BKT"); sodium bismuth titanate (($Bi_{1/2}Na_{1/2}$)$TiO_3$, abbreviated to "BNT"); manganese bismuth ($BiMnO_3$, abbreviated to "BM"); bismuth; potassium; titanium and iron, complex oxides $((1-x)[BiFeO_3]-x[BaTiO_3]$, Abbreviated to "BFO-BT") having the perovskite structure and containing bismuth; iron; barium and titanium, or the latter aforementioned complex oxides $((1-x)[Bi(Fe_{1-y}M_y)O_3]-x[BaTiO_3]$ (M is, Mn, Co or Cr)) to which metals such as manganese, cobalt and chromium are added and the like is used.

In addition, the second electrode film 80 may be any of various metals such as Ir, Pt, W, tantalum (Ta) and molybdenum (Mo). Moreover, alloys of aforementioned various metals or metal oxides such as iridium oxide may be exemplified.

Then, lead electrodes 90 that are drawn out from the vicinity of the end portion of the ink supply channels 14 side, extended onto the zirconium oxide layer 55, and made of, for example, gold (Au) or the like are connected to the respective second electrode films 80 which are the individual electrodes of the piezoelectric elements 300. A voltage is selectively applied to the respective piezoelectric elements 300 through the lead electrodes 90.

Further, above the flow channel forming substrate 10 on which the piezoelectric elements 300 are formed, a protective substrate 30, which has a piezoelectric element holding portion 32 having a space so as not to inhibit the movement of the piezoelectric elements 300, is bonded to the region facing the piezoelectric elements 300 by an adhesive 35. Moreover, it is preferable that the piezoelectric element holding portion 32 have a space so as not to inhibit the movement of the piezoelectric elements 300, while the space may be sealed or not sealed.

In addition, in the protective substrate 30, a manifold portion 31 is provided at the region facing the communication portion 13, and as mentioned above, the manifold portion 31 configures a manifold 100 which is communicating with the communication portion 13 of the flow channel forming substrate 10 to be a common ink chamber for respective pressure generation chambers 12. In addition, at the region between the piezoelectric element holding portion 32 of the protective substrate 30 and the manifold portion 31, a through-hole 33 passing through the protective substrate 30 in the thickness direction is provided. A portion of the first electrode films 60 and a tip portion of the lead electrodes 90 are exposed inside the through-hole 33.

In addition, on the protective substrate 30, a drive circuit (not illustrated) for driving the piezoelectric elements 300 is fixed. The drive circuit and the lead electrodes 90 are electrically connected with each other via the connection wiring made of conductive wire such as a bonding wire.

It is preferable that a material having substantially the same thermal expansion rate as the flow channel forming substrate 10, for example, a glass or ceramic material be used for the protective substrate 30. In the embodiment, the silicon single crystal substrate which is the same material as the flow channel forming substrate 10 is used to form the protective substrate 30.

A compliance substrate 40 configured to include a sealing film 41 and a fixing plate 42 is bonded onto the protective substrate 30. Here, the sealing film 41 is made of a material (for example, polyphenylene sulfide (PPS) film having a thickness of 6 µm) having low rigidity and flexibility, thereby sealing one surface of the manifold portion 31 by the sealing film 41. In addition, the fixing plate 42 is made of a hard material (for example, stainless steel (SUS) having a thickness of 30 µm) such as metal. Since the region facing the manifold 100 of the fixing plate 42 is an opening portion 43 which is completely eliminated in the thickness direction, a surface of the manifold 100 is sealed only by the sealing film 41 having flexibility.

The ink jet type recording head in the embodiment takes an ink in through an external ink supply means (not illustrated) to fill the inside thereof from the manifold 100 to the nozzle openings 21 with the ink. Then, in accordance with a recording signal from the drive circuit, voltages are applied to the portion between the respective first electrode films 60 and the second electrode films 80 corresponding to the pressure generation chambers 12 to cause deflection in the elastic film 50 made of the silicon oxide film 51, the zirconium oxide layer 55, the first electrode film 60 and the piezoelectric layer 70. Accordingly, pressure inside the respective pressure generation chambers 12 increases so as to discharge the ink droplet from the nozzle opening 21. In the embodiment, since the first electrode film 60 or the elastic film 50 and the zirconium oxide layer 55 exhibit high adhesion therebetween, even the actuator is driven to cause the deflection, the first electrode film 60 or the elastic film 50 is not separated from the zirconium oxide layer 55 so as to excel in durability.

Figure 4A:
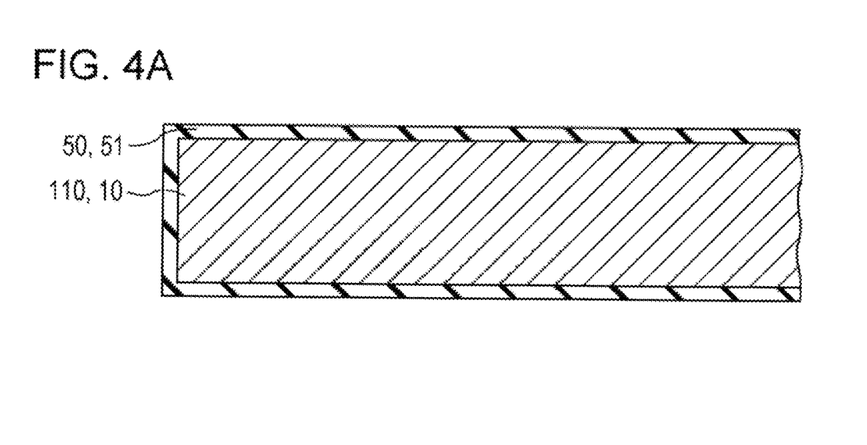
FIGS. 4A, 4B and 4C are cross-sectional views illustrating a manufacturing step of the recording head according to the Embodiment 1.

Here, a manufacturing method of the ink jet type recording head will be described referring to FIGS. 4A to 8B. FIGS. 4A to 8B are cross-sectional views of the pressure generation chambers in the longitudinal direction. First, as illustrated in FIG. 4A, a wafer 110 for flow channel forming substrates, which is a silicon wafer, is subject to thermal oxidization in a diffusion furnace at a temperature of about 1100° C., thereby forming the silicon oxide film 51 configuring the elastic film 50 on the surface thereof.

Figure 4B:
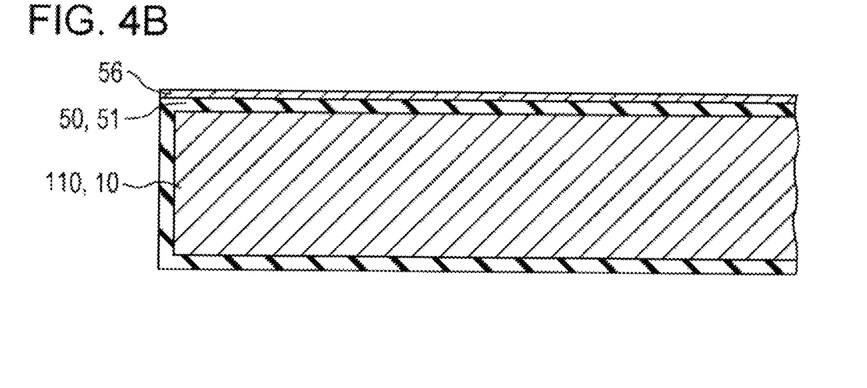
Figure 4C:
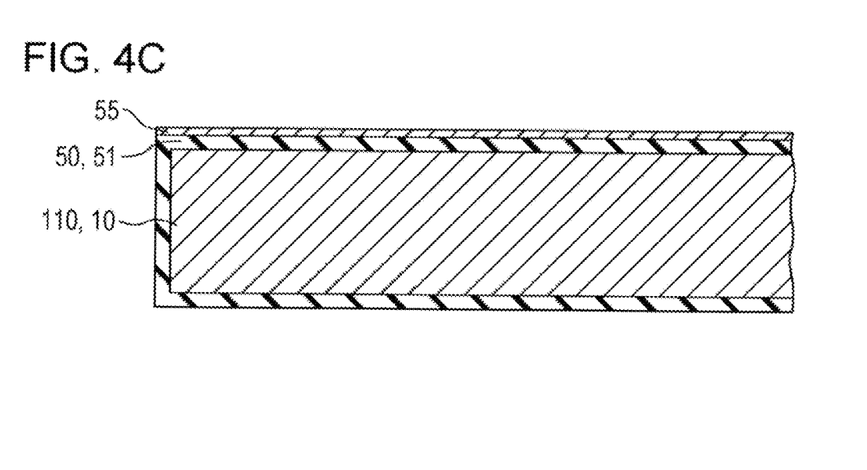

Subsequently, as illustrated in FIGS. 4B and 4C, the zirconium oxide layer 55 is formed on the silicon oxide film 51. In the embodiment, the zirconium oxide layer 55 is formed by the liquid-phase method. That is, as illustrated in FIG. 4B, a precursor layer 56 is formed on the silicon oxide film 51 by coating a precursor solution of the zirconium oxide, thereby crystallizing the precursor layer 56 to obtain the zirconium oxide layer 55 (FIG. 4C).

The precursor solution of the zirconium oxide used in the liquid-phase method contains metal alkoxide containing Zr or metal carboxylate containing Zr.

Here, as the metal alkoxide, tetramethoxy zirconium, tetraethoxy zirconium, tetrapropoxy zirconium, tetraisopropoxy zirconium, tetrabutoxy zirconium, tetrahexyl zirconium and tetrakis (2,4-pentanedionate) zirconium may be exemplified. However, the alkoxide is not particularly limited as long as Zr is contained.

In addition, as the metal carboxylate, zirconium acetate, zirconium propionate, zirconium tributoxy propionate, tetrakis (butanoic acid), zirconium 2-ethylhexanoate and zirconium stearate may be exemplified. However, the carboxylate is not particularly limited as long as Zr is contained.

The precursor solution is obtained by dissolving the metal alkoxide or the metal carboxylate into a solvent containing carboxylic acid. The carboxylic acid is not particularly limited, and acetic acid, propionic acid and butanoic acid may be exemplified, for example. However, it is preferable to use the acetic acid.

In addition, since it is possible to easily form a comparatively thick film by improving coatability of the precursor solution, it is preferable to contain a thickener. As the thickener, for example, it is possible to use an organic polymer compound such as polyethylene glycol, polyvinyl acetate, hydroxypropyl cellulose, polyethylene glycol monomethyl ether, polypropylene glycol, polyvinyl alcohol, polyacrylic acid, polyamides, polyamic acid, acetyl cellulose. However, it is preferable to use the polyethylene glycol.

The above-mentioned precursor solution is for a case where the zirconium oxide layer 55 is a $ZrO_2$ layer. However, the zirconium oxide layer 55 may be an yttria-stabilized zirconia (YSZ) layer that contains the yttria-stabilized zirconia (YSZ). If the yttria-stabilized zirconia (YSZ) layer is formed by the liquid-phase method, the precursor solution is obtained by adding a solution containing yttrium ion into the metal alkoxide or the metal carboxylate containing Zr. Here, the solution containing the yttrium ion is not particularly limited, and yttrium acetate solution, yttrium propionate solution, for example, yttrium chloride solution and yttrium nitrate solution may be exemplified.

Hereinafter, forming of the zirconium oxide layer 55 will be described.

First, the metal alkoxide or the metal carboxylate and the thickener are added to the carboxylic acid. Then, water ($H_2O$) is added thereto, and heating and stirring are carried out for about 2 hours at a temperature of about 70° C. so as to obtain a uniform and transparent precursor solution. The precursor solution is applied on the substrate at a rotational speed of 1400 rpm by the spin coat method (coating). Next, the solution coating the substrate is heated up to a temperature of 160° C. to 200° C. and dried for about 5 minutes so as to obtain a dried film (drying). Then, the dried film is heated up to a temperature of about 375° C. to 415° C. and held for about 5 minutes so as to be degreased (degreasing). Meanwhile, the greasing mentioned here represents that organic components contained in the dried film are separated into, for example, $NO_2$, $CO_2$, $H_2O$ and the like. If it is desired to obtain a thicker zirconium oxide layer 55, the dried film may be returned to the initial coating step after the degreasing. Subsequently, the drying and greasing may be repeated. After the greasing, the dried film is heated up to 750° C. to 850° C. and held for about 3 minutes so as to be crystallized (calcining). If it is desired to obtain a still thicker zirconium oxide layer 55, the dried film may be returned to the initial coating after the calcining. Subsequently, drying, degreasing and calcining may be repeated. Then, after the calcining, the dried film is heated up to a temperature of 800° C. to 950° C. and held for about 1 hour, thereby forming the zirconium oxide layer 55 (firing). Meanwhile, as a heater employed in the drying, degreasing, calcining and firing, for example, a rapid thermal annealing (RTA) device, which carries out heating by irradiation of an infrared lamp, or a hot plate may be exemplified.

In the embodiment, in order to carry out a deposition onto the zirconium oxide layer 55 having a thickness of 400 nm, the coating, drying and degreasing are repeated twice. Then, after the calcining, the coating, drying, degreasing and calcining are repeated. Besides, in order to carry out the deposition onto the zirconium oxide layer 55 having a thickness of 200 nm, the coating, drying and degreasing are repeated twice.

Through the deposition of the zirconium oxide layer 55 by the liquid-phase method, it is possible to easily form a precursor film having a desired thickness by repeating the above-mentioned coating, drying and degreasing, or by repeating the coating, drying and degreasing after the calcining. In addition, the deposition by the liquid-phase method has smaller environmental loads than that of the gas-phase method such as the sputtering method so as to be suitable for mass production. Accordingly, there is an advantage that the manufacturing cost may be reduced.

Moreover, in the related art, the zirconium oxide layer, which is formed by the thermal oxidization of the zirconium layer after the deposition of the zirconium layer by the gas-phase method such as the sputtering method, has been known to be made of columnar crystal, as mentioned below.

The zirconium oxide layer 55 by the liquid-phase method of the invention is distinguished from the columnar crystal zirconium oxide layer by the gas-phase method in the related art, and it has been found that the zirconium oxide layer 55 by the liquid-phase method has a more minute layer than the zirconium oxide layer by the gas-phase method. That is, if the zirconium oxide layer 55 by the liquid-phase method of the invention is observed through a scanning type electron microscope (SEM), as mentioned below, the zirconium oxide layer 55 is laminated in a state where uniform crystal grains are closely spread across such that it is hard to find a gap, thereby being minute. On the other hand, a few gaps are found in the zirconium oxide layer by the gas-phase method so as not to be minute as the zirconium oxide layer 55 by the liquid-phase method of the invention. The zirconium oxide layer 55 by the liquid-phase method exhibits high adhesion to the first electrode film 60 or the elastic film 50 so as to excel in durability.

Further, in order to determine the adhesion of the zirconium oxide layer 55 of the invention with respect to the first electrode film 60 or the elastic film 50, as mentioned below, the scratch resistance (mN) of the zirconium oxide layer is measured using a thin film scratch tester, and it has been found that the zirconium oxide layer 55 by the liquid-phase method exhibits extremely higher scratch resistance than that of the columnar crystal zirconium oxide layer. The granular crystal zirconium oxide layer 55 of the invention exhibits extremely high scratch resistance so as to greatly excel in adhesion.

Figure 5A:
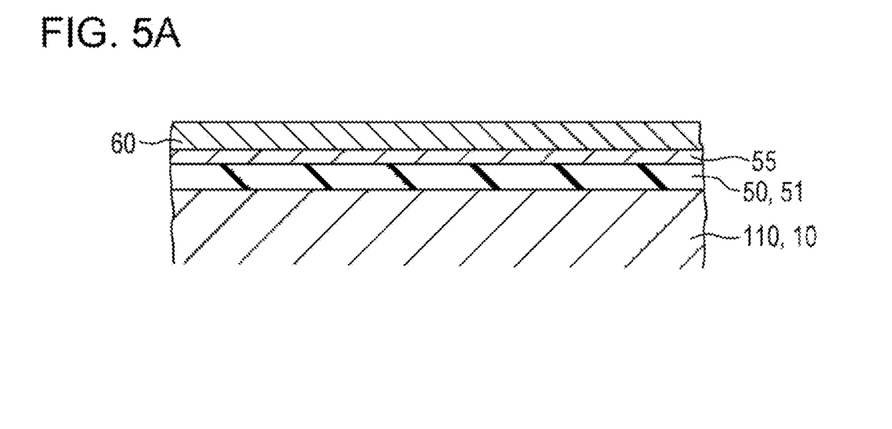
FIGS. 5A, 5B and 5C are cross-sectional views illustrating the manufacturing step of the recording head according to the Embodiment 1.

After the zirconium oxide layer 55 is formed, for example, titanium (Ti), platinum (Pt) and iridium (Ir) are laminated on the zirconium oxide layer 55 by the sputtering method, thereby forming the first electrode film 60, as illustrated in FIG. 5A.

Next, the piezoelectric layer 70 made of lead zirconate titanate (PZT) and the like is formed on the first electrode film 60. Here, in the embodiment, so-called sol obtained by dissolving and dispersing metal organic materials in a solvent is applied and dried so as to be gelled, and is subject to the firing at high temperature, thereby forming the piezoelectric layer 70 through the so-called sol-gel method in which the piezoelectric layer 70 made of metal oxides is obtained. Moreover, without being limited to the sol-gel method, for example, the metal-organic decomposition (MOD) method may be employed. In addition, the sputtering method may be employed.

Figure 5B:
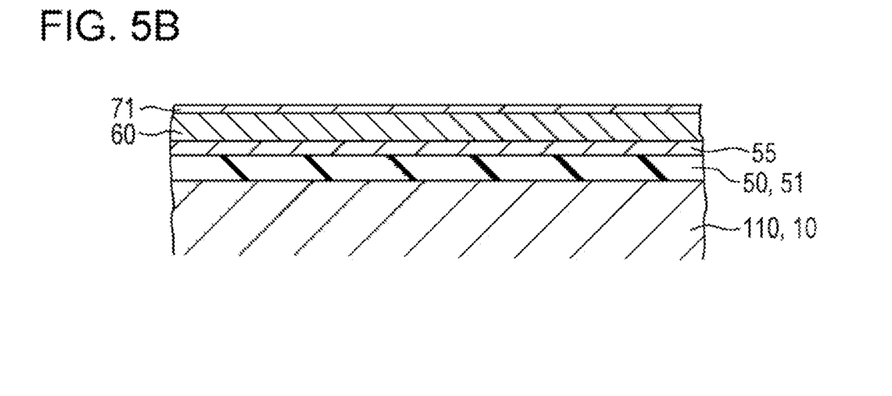

As specific procedures of forming the piezoelectric layer 70, first, as illustrated in FIG. 5B, a piezoelectric precursor film 71, which is a PZT precursor film, is formed on the first electrode film 60. That is, the sol (solution) containing a metallo-organic compound (lead zirconate titanate) is applied on the flow channel forming substrate 10 on which the first electrode film 60 is formed by the spin coat method to form the piezoelectric precursor film 71 (coating). Next, the piezoelectric precursor film 71 is heated up to a predetermined temperature and dried for a certain period (drying). Then, the dried piezoelectric precursor film 71 is heated up to a predetermined temperature and held for a certain period so as to be degreased (degreasing). Meanwhile, the greasing mentioned here represents that the organic components contained in the piezoelectric precursor film 71 are separated into, for example, $NO_2$, $CO_2$, $H_2O$, and the like.

Figure 5C:
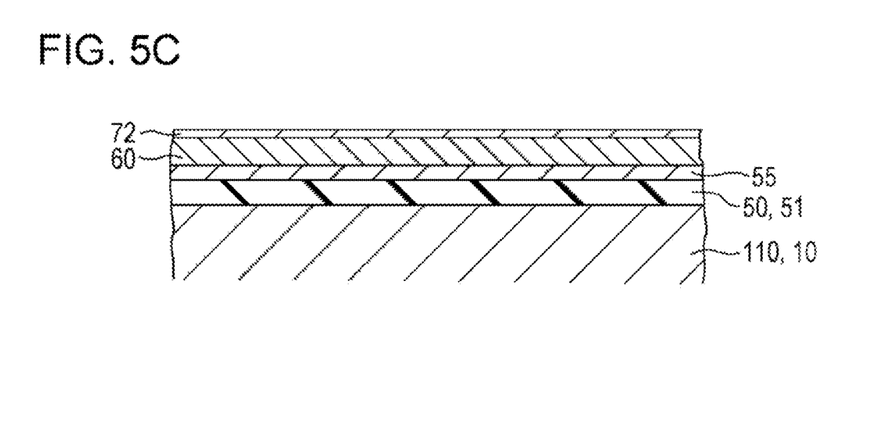

Next, as illustrated in FIG. 5C, the piezoelectric precursor film 71 is heated up to a predetermined temperature and held for a certain period so as to be crystallized, thereby forming the piezoelectric film 72 (firing). Meanwhile, as the heater employed in the drying, degreasing and firing, the rapid thermal annealing (RTA) device, which carries out the heating by the irradiation of an infrared lamp, or the hot plate may be exemplified.

Figure 6A:
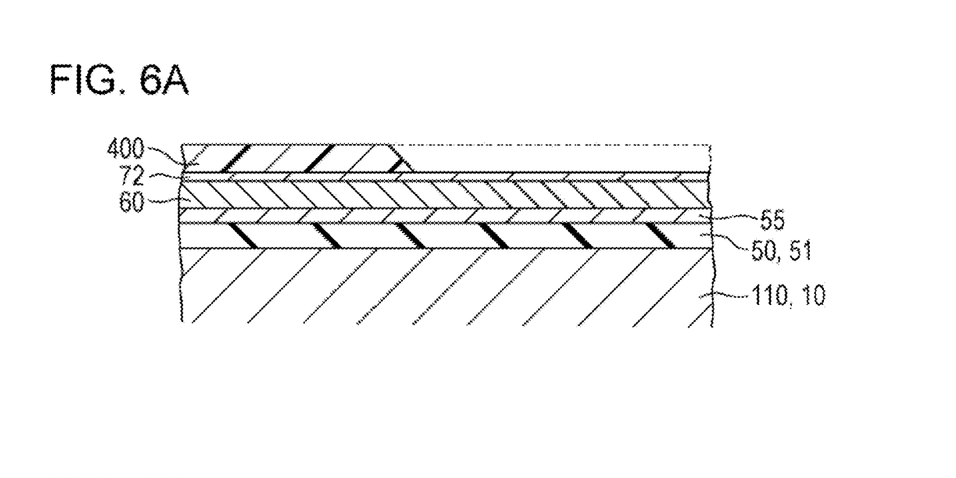
FIGS. 6A, 6B and 6C are cross-sectional views illustrating the manufacturing step of the recording head according to the Embodiment 1.
Figure 6B:
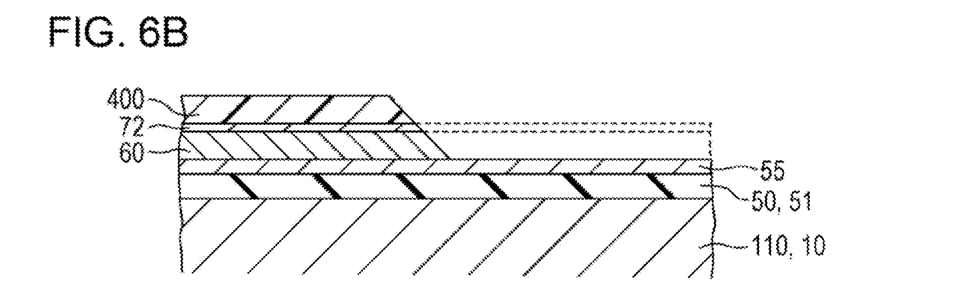

Next, as illustrated in FIG. 6A, a resist 400 is formed on the piezoelectric film 72 and patterned in a predetermined shape. Then, as illustrated in FIG. 6B, the first electrode film 60 and the piezoelectric film 72 which is the first layer, having the resist 400 as a mask are patterned at the same time to be inclined with the side surfaces thereof.

Figure 6C:
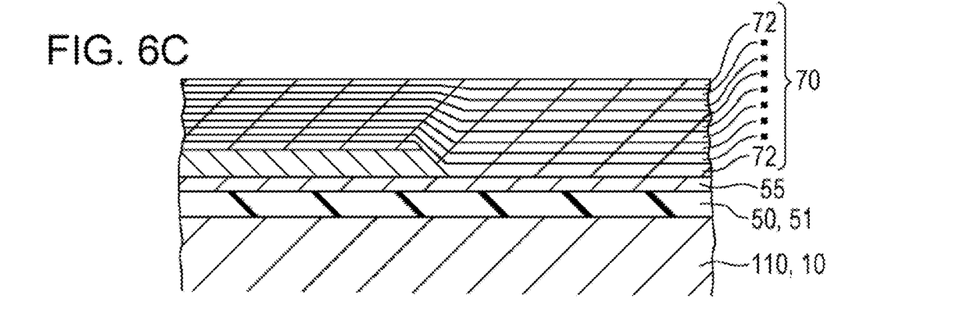

Subsequently, after the resist 400 is peeled off, the piezoelectric layer 70 having a plurality of piezoelectric films 72 is formed by repeating the forming steps of the piezoelectric film plural times, which are the coating, drying, degreasing and firing mentioned above, thereby forming the piezoelectric layer 70 having a predetermined thickness including the plurality of layers of the piezoelectric film 72, as illustrated in FIG. 6C. For example, the entire film thickness of the piezoelectric layer 70 including the plurality of layers of the piezoelectric film is set to be about 1 to 3 μm by causing the film thickness of the sol per coating to be extremely thin. Although the piezoelectric films 72 are provided by laminating in the embodiment, the piezoelectric film 72 may be configured to have only one layer by thickening the film thickness of one layer. The piezoelectric layer 70 obtained in the above-mentioned manner is smooth on the surface and has no protruded region.

Figure 7A:
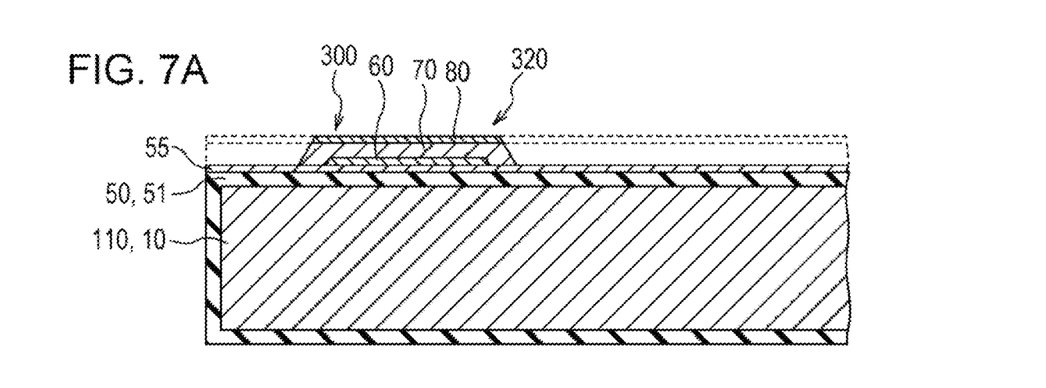
FIGS. 7A, 7B and 7C are cross-sectional views illustrating the manufacturing step of the recording head according to the Embodiment 1.

After the piezoelectric layer 70 is formed, as illustrated in FIG. 7A, the second electrode film 80 made of 1r is formed across the entire surface on the piezoelectric layer 70 by the sputtering method or the like. Then, the piezoelectric element 300 including the first electrode film 60, piezoelectric layer 70 and the second electrode film 80 is formed by patterning at the region facing each pressure generation chamber 12. Further, it is possible to pattern the piezoelectric layer 70 and the second electrode film 80 in a lump by dry etching via a resist (not illustrated) formed in a predetermined shape. Moreover, when carrying out the dry etching, a side surface of the resist is set to be inclined in advance such that the piezoelectric layer 70 and the second electrode film 80 are patterned to have a narrow width at the second electrode film 80 side. Accordingly, the side surfaces thereof are formed to be inclined surfaces.

Figure 7B:
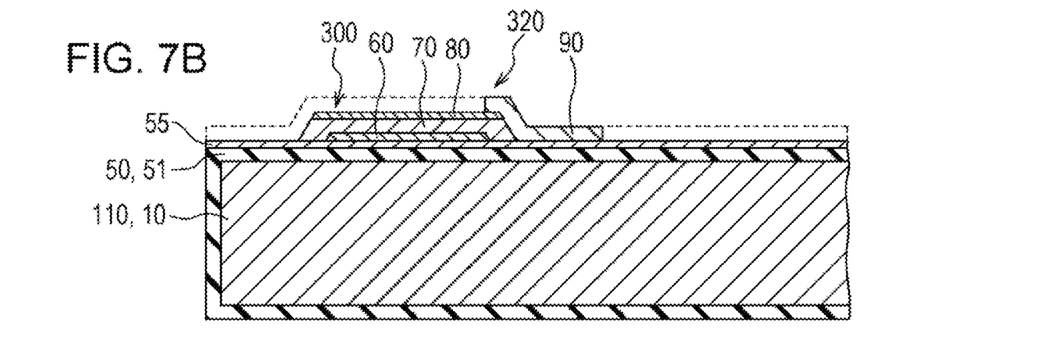

Next, as illustrated in FIG. 7B, the lead electrode 90, for example, made of gold (Au) is formed across the entire surface of the wafer 110 for flow channel forming substrates. Subsequently, for example, each piezoelectric element 300 is respectively patterned through a mask patterning (not illustrated) of the resist and the like.

Figure 7C:
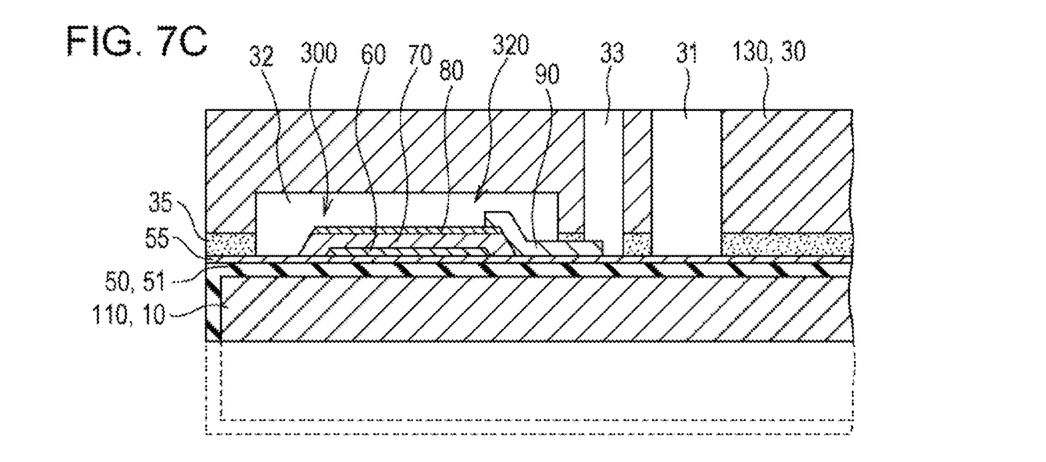

Next, as illustrated in FIG. 7C, a wafer 130 for protective substrates which is a silicon wafer and serves as a plurality of protective substrates 30 is bonded to the piezoelectric element 300 side of the wafer 110 for flow channel forming substrates by the adhesive 35. Further, since the wafer 130 for protective substrates has a thickness of, for example, several hundred μm, the rigidity of the wafer 110 for flow channel forming substrates is remarkably improved by bonding the wafer 130 for protective substrates.

Figure 8A:
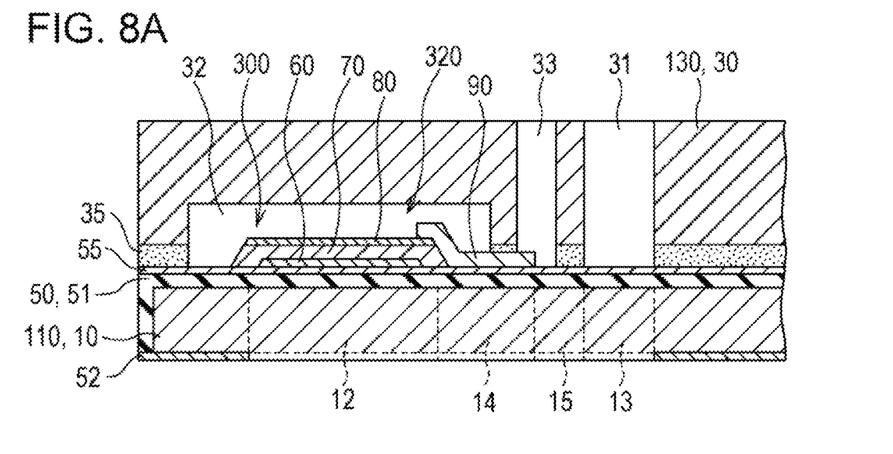
FIGS. 8A and 8B are cross-sectional views illustrating the manufacturing step of the recording head according to the Embodiment 1.

Next, as illustrated in FIG. 8A, the wafer 110 for flow channel forming substrates is caused to be thin until a certain thickness is obtained. In addition, for example, a mask film 52 is newly formed and patterned in a predetermined shape on the wafer 110 for flow channel forming substrates.

Figure 8B:
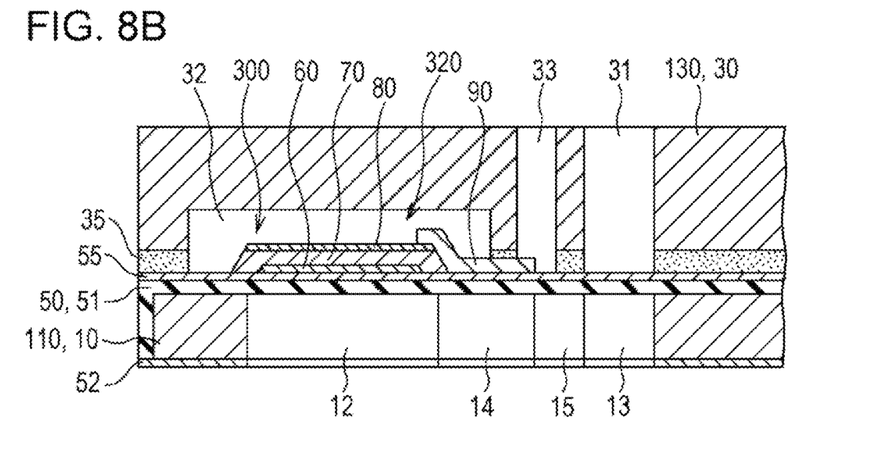

Then, as illustrated in FIG. 8B, the wafer 110 for flow channel forming substrates is subject to anisotropic etching (wet etching) using an alkaline solution such as KOH via the mask film 52, thereby forming the pressure generation chambers 12 corresponding to the piezoelectric elements 300, the communication portion 13, the ink supply channels 14, the communication channels 15 and the like.

Subsequently, unnecessary parts at the outer periphery edge portion of the wafer 110 for flow channel forming substrates and the wafer 130 for protective substrates are removed, for example, by cutting such as dicing or the like. Then, after removing the silicon oxide film 51 of the wafer 110 for flow channel forming substrates, which is at the opposite side surface of the wafer 130 for protective substrates, the nozzle plate 20 where the nozzle openings 21 are drilled is bonded thereto, while the compliance substrate 40 is bonded to the wafer 130 for protective substrates. Accordingly, the ink jet type recording head in the embodiment is obtained by dividing the wafer 110 for flow channel forming substrates into the flow channel forming substrates 10 having a size of a chip, as illustrated in FIG. 1.

EXAMPLES

Hereinafter, detailed descriptions will be given based on examples and comparative examples.

Example 1

A wafer 110 for flow channel forming substrates is subject to thermal oxidization in a diffusion furnace at a temperature of 1100° C. to form the silicon oxide film 51 having a thickness of 1 μm. Then, the zirconium oxide layer 55 having a thickness of 400 nm is formed on the silicon oxide film 51 by the liquid-phase method. The zirconium oxide layer 55 is formed through the following procedures.

First, zirconium acetate 79.32 g (manufactured by SIGMA-ALDRICH CO. LLC.) (molecular weight 327.4) which is an ingredient of the zirconium oxide, and a thickener polyethylene glycol (mean molecular weight 600) 44.39 g are added to acetic acid 66.58 g (special grade, manufactured by KANTO CHEMICAL CO., INC.). Then water 44.39 g is added thereto, and heating and stirring are carried out for about 1 hour at a temperature of 60° C. to obtain a precursor solution which is uniform and transparent. Subsequently, the precursor solution is applied on a substrate at a rotational speed of 1400 rpm by the spin coat method (coating).

Next, the solution coating the substrate is heated up to a temperature of 160° C. and dried for 5 minutes so as to obtain a dried film (drying). Then, the dried film is heated up to a temperature of 415° C. and held for 5 minutes so as to be degreased (degreasing). After the degreasing, the dried film is returned to the first coating step. Then, the drying and greasing are carried out. Subsequently, the dried film is heated up to a temperature of 800° C. at a temperature rising rate of 100° C./sec and held for 3 minutes so as to be crystallized (calcining).

After the calcining, the dried film is returned to the first coating step. Subsequently, drying, degreasing and calcining are repeated twice. Then, the dried film is heated up to a temperature of 800° C. at a temperature rising rate of 100° C./sec and held for 60 minutes, thereby forming the zirconium oxide layer 55 (firing). Meanwhile, as a heater employed in the drying, degreasing, calcining and firing, a rapid thermal annealing (RTA) device, which carries out heating by irradiation of an infrared lamp, is used.

Example 2

The zirconium oxide layer 55 having a thickness of 400 nm is formed on the silicon oxide film 51 by the liquid-phase method. In the Example 1, the firing is carried out at a temperature of 800° C. and a temperature rising rate of 100° C./sec though, in the present example, the firing is carried out under the condition at a temperature of 850° C. and a temperature rising rate of 60° C./sec. Other conditions are the same as the Example 1.

Comparative Example 1

The zirconium oxide layer 55 having a thickness of 400 nm is formed on the silicon oxide film 51 by the liquid-phase method. In the Example 1, the firing is carried out at a temperature of 800° C. and a temperature rising rate of 100° C./sec though, in the Comparative Example 1, the firing is carried out under the conditions at a temperature of 900° C. and a temperature rising rate of 60° C./sec. Other conditions are the same as the Example 1.

Comparative Example 2

The zirconium oxide layer 55 having a thickness of 400 nm is formed on the silicon oxide film 51 by the liquid-phase method. In the Example 1, the firing is carried out at a temperature of 800° C. and a temperature rising rate of 100° C./sec though, in the Comparative Example 2, the firing is carried out under the conditions at a temperature of 900° C. and a temperature rising rate of 100° C./sec. Other conditions are the same as the Example 1.

Comparative Example 3

The zirconium oxide layer 55 having a thickness of 400 nm is formed on the silicon oxide film 51 by the liquid-phase method. In the Example 1, the firing is carried out at a temperature of 800° C. and a temperature rising rate of 100° C./sec though, in the Comparative Example 3, the firing is carried out under the conditions at a temperature of 1000° C. and a temperature rising rate of 100° C./sec. Other conditions are the same as the Example 1.

Comparative Example 4

The zirconium oxide layer 55 having a thickness of 400 nm is formed on the silicon oxide film 51 by the liquid-phase method. In the Example 1, the degreasing is carried out at a temperature of 415° C. and the firing is carried out at a temperature of 800° C. and a temperature rising rate of 100° C./sec though, in the Comparative Example 4, the degreasing is carried out under the condition at a temperature of 375° C. and the firing is carried out under the conditions at a temperature of 900° C. and a temperature rising rate of 100° C./sec. Other conditions are the same as the Example 1.

Comparative Example 5

The zirconium oxide layer 55 having a thickness of 400 nm is formed on the silicon oxide film 51 by the liquid-phase method. In the Example 1, the degreasing is carried out at a temperature of 415° C. and the firing is carried out at a temperature of 800° C. and a temperature rising rate of 100° C./sec though, in the Comparative Example 5, the degreasing is carried out under the condition at a temperature of 395° C. and the firing is carried out under the conditions at a temperature of 900° C. and a temperature rising rate of 100° C./sec. Other conditions are the same as the Example 1.

Comparative Example 6

The zirconium oxide layer 55 having a thickness of 400 nm is formed on the silicon oxide film 51 by the liquid-phase method. In the Example 1, the degreasing is carried out at a temperature of 415° C. and the firing is carried out at a temperature of 800° C. and a temperature rising rate of 100° C./sec though, in the Comparative Example 6, the degreasing is carried out under the condition at a temperature of 435° C. and the firing is carried out under the conditions at a temperature of 900° C. and a temperature rising rate of 100° C./sec. Other conditions are the same as the Example 1.

Comparative Example 7

In the Comparative Example 7, a zirconium layer is formed by the sputtering method. Then, the zirconium oxide layer is formed by the thermal oxidization of the zirconium layer. Hereinafter, the procedure will be described. First, a wafer 110 for flow channel forming substrates is subject to the thermal oxidization in a diffusion furnace at a temperature of about 1100° C. to form the silicon oxide film 51 having a thickness of 1 μm. Then, the zirconium layer having a thickness of 200 nm is formed on the silicon oxide film 51 by the DC sputtering method. Subsequently, the wafer 110 for flow channel forming substrates in which the zirconium layer is formed is put into the thermal oxidization furnace heated up to 700° C. or higher. Then, the zirconium layer is subject to the thermal oxidization, while oxidized gas containing oxygen is continuously supplied thereto at the flow rate of 15 liters per minute, thereby forming the zirconium oxide layer. Besides, a horizontal-type furnace manufactured by KOYO-LINDBERG CO., LTD. is used as the thermal oxidization furnace.

Experimental Example 1

Throughout the Examples 1 and 2, and the Comparative Examples 1 to 6, a crystalline structure of the zirconium oxide layer is observed using a scanning type electron microscope (SEM).

Figure 9A:
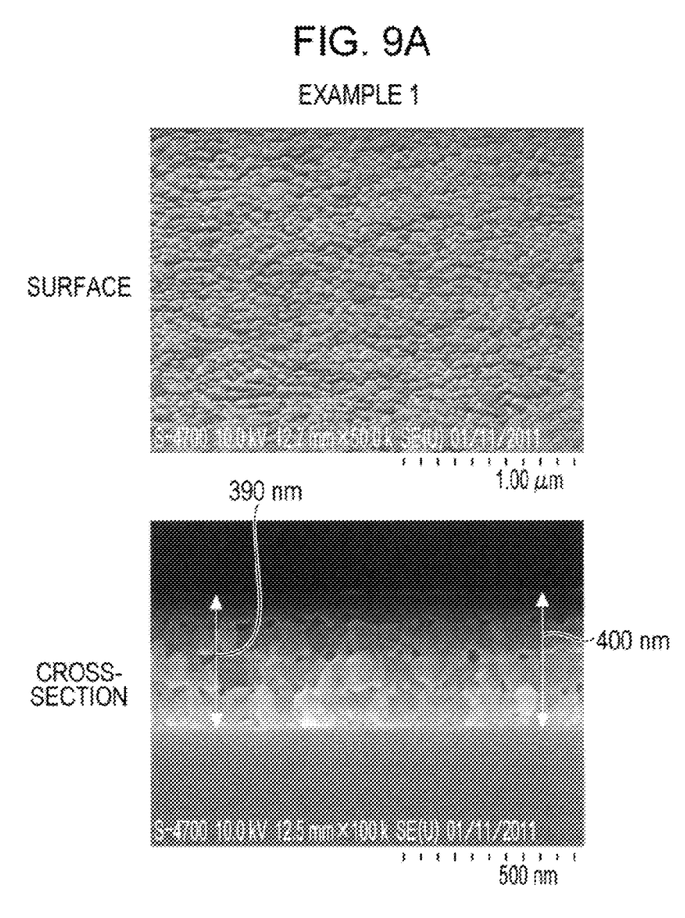
FIGS. 9A and 9B are SEM observation photographs of an Example 1 and a Comparative Example 1.
Figure 9B:
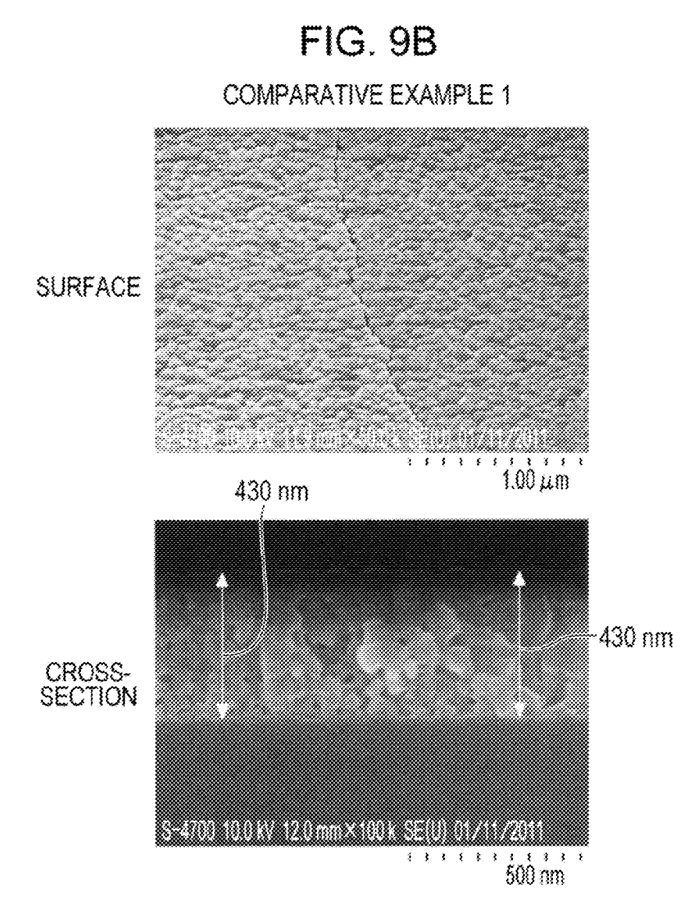

On behalf of the crystalline structure, photographs of surfaces and cross sections of the zirconium oxide layer 55 having a thickness of 400 nm in the Example 1 and the zirconium oxide layer having a thickness of 430 nm in the Comparative Example 1 are respectively shown in FIGS. 9A and 9B.

As a result, no crack is observed on the surface of the zirconium oxide layer 55 in the Example 1. In addition, the cross section has the structure of closely spread crystal grains having uniform granular shape such that it is hard to find a gap. On the other hand, a crack is observed on the zirconium oxide layer 55 in the Comparative Example 1. In addition, according to the result of the SEM observation in the Example 2, no crack is observed as the Example 1, while the similar crack as the Comparative Example 1 is observed in the Comparative Examples 2 to 6.

Experimental Example 2

Throughout the Examples 1 and 2, and the Comparative Examples 1 to 6, the X-ray diffraction measurement for the zirconium oxide layer is carried out. The percentage of the X-ray diffraction peak intensity corresponding to the respective crystal planes is shown in the following Table 1.

As a result, it has been found that the zirconium oxide layers in which no crack is observed in the Examples 1 and 2 are preferentially oriented with the (111) plane. Meanwhile, in the Comparative Examples 1 to 6 in which a crack is observed, it has been found that the zirconium oxide layers are preferentially oriented mainly with the (−111) plane. In addition, it has been found that every zirconium oxide in the Examples 1 and 2, and the Comparative Examples 1 to 6 is a monoclinic crystal.

Accordingly, it has been found that occurrence of cracks is prevented in the zirconium oxide layer preferentially oriented with the (111) plane.

TABLE 1

| | XRD peak intensity (%) | | | | | |
|---|---|---|---|---|---|---|
| | (100) | (−111) | (200) | (111) | (−112) | crack |
| Example 1 | 17 | 20 | 0 | 60 | 4 | absence |
| Example 2 | 11 | 27 | 0 | 57 | 5 | absence |
| Comparative Example 1 | 12 | 48 | 0 | 35 | 5 | observed |
| Comparative Example 2 | 11 | 49 | 0 | 34 | 6 | observed |
| Comparative Example 3 | 8 | 61 | 0 | 27 | 5 | observed |
| Comparative Example 4 | 11 | 56 | 0 | 26 | 7 | observed |
| Comparative Example 5 | 12 | 51 | 0 | 32 | 4 | observed |
| Comparative Example 6 | 12 | 50 | 0 | 34 | 5 | observed |

Experimental Example 3

Throughout the Examples 1 and 2, and the Comparative Example 7, scratch resistance (mN) of the zirconium oxide layer is measured by the thin film scratch tester (brand name: CSR-02, manufactured by RHESCA CORPORATION). The result is shown in the Table 2.

As a result, scratch resistance of the zirconium oxide layers in both the Examples 1 and 2 having a thickness of 400 nm is 1000 mN (measurement limit) or more, while the scratch resistance of the zirconium oxide layer in the Comparative Example 1 is 300 mN to 600 mN. Accordingly, it has been found that the zirconium oxide layer processed by the liquid-phase method significantly excels in adhesion compared to the zirconium oxide layer processed by the gas-phase method.

In a liquid ejecting head, resolution of respective discharge port arrays discharging liquid droplets is 300 dpi and 600 dpi so as to increase the resolution each year such that there are demands for far higher scratch resistance than that of 300 mN which has been considered to be sufficient in the related art. However, in the zirconium oxide layer made of granular crystal, it is possible to obtain 1000 mN or greater which is the measurement limit. Therefore, it has been found that the zirconium oxide layer excels in adhesion applicable to the liquid ejecting head having the high resolution.

TABLE 2

| | Example 1 | Example 2 | Comparative Example 7 |
|---|---|---|---|
| scratch resistance | 1000 mN or greater, measurement limit | 1000 mN or greater, measurement limit | 300 mN to 600 mN |

Another Embodiment

An embodiment of the invention has been described above. However, elementary configuration of the invention is not limited to the Embodiment 1 mentioned above. For example, in the Embodiment 1 described above, though the silicon oxide layer and the zirconium oxide layer are provided on a substrate in order, the zirconium oxide layer may be provided directly on the substrate using the substrate made of metal oxides. Mg may be exemplified as a metal for the metal oxide. The configuration leads to an actuator which excels in the adhesion between the first electrode film or the substrate and the zirconium oxide layer. Moreover, it is preferable that a surface side where the zirconium oxide layer is provided be the substrate made of the metal oxide. For example, the substrate having the metal oxide film provided on the side where the zirconium oxide layer of a substrate main body is provided may be employed.

In addition, in the Embodiment 1 described above, although an ink jet type recording head is exemplified as an example of a liquid ejecting head, the invention is extensively intended for general liquid ejecting heads such that it is also possible to be applied to a liquid ejecting head ejecting liquids other than the ink, as a matter of course. As other types of the liquid ejecting head, for example, various recording heads employed in an image recording device such as a printer, a color material ejecting head employed in manufacturing color filters such as a liquid crystal display, an electrode material ejecting head employed in forming of electrodes of an organic EL display and a field emission display (FED), and a bio-organic material ejecting head employed in manufacturing biochips. Further, as a matter of course, the invention may be applied not only to an actuator to be mounted on the liquid ejecting head (such as ink jet type recording head), but also in any type of the apparatus to which the actuators to be mounted.

Moreover, it is possible to apply the invention to various sensors such as an ultrasonic sensor which adopts piezoelectric effect of a piezoelectric element.

The entire disclosure of Japanese Patent Application No. 2012-234491, filed Oct. 24, 2012 is expressly incorporated by reference herein.

What is claimed is:

1. A liquid ejecting head comprising:
  a zirconium oxide layer;
  a piezoelectric element provided above the zirconium oxide layer,
  wherein the piezoelectric element includes a piezoelectric layer and an electrode provided on the piezoelectric layer,
  wherein the zirconium oxide layer is formed through a liquid-phase method and is preferentially oriented with a (111) plane.

2. The liquid ejecting head according to claim 1,
  wherein the zirconium oxide layer is made of monoclinic crystal or cubic crystal.

3. A liquid ejecting apparatus comprising the liquid ejecting head according to claim 2.

4. The liquid ejecting head according to claim 1,
  wherein the zirconium oxide layer has a structure of granular crystal.

5. A liquid ejecting apparatus comprising the liquid ejecting head according to claim 4.

6. A liquid ejecting apparatus comprising the liquid ejecting head according to claim 1.

7. A piezoelectric element comprising:
  a piezoelectric layer and an electrode provided on the piezoelectric layer,
  wherein the piezoelectric layer is provided above a zirconium oxide layer,
  wherein the zirconium oxide layer is formed through a liquid-phase method and is preferentially oriented with the (111) plane.

8. The piezoelectric element according to claim 7,
  wherein the zirconium oxide layer is made of monoclinic crystal or cubic crystal.

* * * * *